(12) United States Patent
Kim et al.

(10) Patent No.: US 10,201,094 B2
(45) Date of Patent: Feb. 5, 2019

(54) SYSTEMS FOR ENCAPSULATING A HYBRID ASSEMBLY OF ELECTRONIC COMPONENTS AND ASSOCIATED METHODS

(71) Applicant: Medtronic, Inc., Minneapolis, MN (US)

(72) Inventors: Chunho Kim, Phoenix, AZ (US); Songhua Shi, Chandler, AZ (US); Mark S. Ricotta, Tempe, AZ (US); Scott B. Sleeper, Apache Junction, AZ (US); Yongqian Wang, Chandler, AZ (US)

(73) Assignee: Medtronic, Inc., Minneapolis, MN (US)

( * ) Notice: Subject to any disclaimer, the term of this patent is extended or adjusted under 35 U.S.C. 154(b) by 848 days.

(21) Appl. No.: 14/561,248

(22) Filed: Dec. 5, 2014

(65) Prior Publication Data

US 2015/0342060 A1 Nov. 26, 2015

Related U.S. Application Data

(60) Provisional application No. 62/000,885, filed on May 20, 2014.

(51) Int. Cl.
*H05K 3/28* (2006.01)
*B29C 45/14* (2006.01)

(52) U.S. Cl.
CPC ....... *H05K 3/284* (2013.01); *B29C 45/14336* (2013.01); *B29C 45/14639* (2013.01); *B29C 45/14836* (2013.01); *H05K 3/28* (2013.01); *H05K 2203/1316* (2013.01); *H05K 2203/1572* (2013.01)

(58) Field of Classification Search
CPC ........ B29C 45/14336; B29C 45/14639; B29C 45/14836; B29C 45/02; B29C 45/021; B29C 2045/24672; H05K 2203/1316; H05K 2203/1322; H05K 2203/1572; H05K 3/284

See application file for complete search history.

(56) References Cited

U.S. PATENT DOCUMENTS

| | | |
|---|---|---|
| 4,282,176 A | 8/1981 | Farrell |
| 4,372,740 A | 2/1983 | Kuramochi et al. |

(Continued)

FOREIGN PATENT DOCUMENTS

DE 200810052771 A1 4/2009

OTHER PUBLICATIONS

Telectronics Pacing Systems, Meta DDDR Model 1254 Physician's Manual, Feb. 1993, p. 24.

*Primary Examiner* — Stella K Yi

(57) ABSTRACT

During a process to encapsulate electronic components and attachment interfaces thereof on a first side of a substrate of a hybrid assembly, a fluid is supplied to a trench of an encapsulation system in which the hybrid assembly is loaded, and a balancing pressure is delivered by the fluid within the trench, during the encapsulation process, to support the hybrid assembly from an opposing second side of the substrate. A regulator of a fluid supply of the system may maintain the balancing pressure, for example, being controlled by a controller of the system that is configured to estimate a pressure within a molding cavity of the system.

11 Claims, 5 Drawing Sheets

(56) References Cited

U.S. PATENT DOCUMENTS

| | | | |
|---|---|---|---|
| 4,632,653 A | 12/1986 | Plocher | |
| 4,710,419 A | 12/1987 | Gregory | |
| 4,779,835 A | 10/1988 | Fukushima et al. | |
| 4,828,769 A | 5/1989 | Maus et al. | |
| 5,344,596 A | 9/1994 | Hendry | |
| 6,143,581 A * | 11/2000 | Johnson | H01L 21/56 257/E21.502 |
| 6,432,350 B1 | 8/2002 | Seres et al. | |
| 6,764,292 B2 | 7/2004 | Hendry | |
| 6,857,685 B2 | 2/2005 | Tsai et al. | |
| 6,915,566 B2 | 7/2005 | Abbott et al. | |
| 7,168,942 B1 | 1/2007 | Wieder | |
| 7,517,207 B2 | 4/2009 | Tsai | |
| 8,268,217 B2 | 9/2012 | Peters et al. | |
| 8,721,322 B2 | 5/2014 | McAteer et al. | |
| 2006/0168552 A1 | 7/2006 | Farnworth et al. | |
| 2009/0026649 A1* | 1/2009 | Peters | B29C 39/42 264/85 |

* cited by examiner

SYSTEMS FOR ENCAPSULATING A HYBRID ASSEMBLY OF ELECTRONIC COMPONENTS AND ASSOCIATED METHODS

FIELD OF THE DISCLOSURE

The present disclosure pertains generally to implantable medical devices and more specifically to hybrid assemblies of electronic components including encapsulation techniques and attachment interfaces thereof.

BACKGROUND

A typical build process for a hybrid assembly includes the step of attaching electronic components (e.g., silicon dies) to attach pads formed on a first side of a substrate (e.g., via the application and subsequent curing of an adhesive material), followed by a step that electrically attaches or connects each component to the substrate or to at least one other attached electronic component. Attachments for the electrical connection of each component may be formed by a solder joint bond, by a diffusion bond, or by a wire bond. The components and the attachment interfaces thereof are then encapsulated, for example, with an epoxy mold compound (EMC) that may be injected over the first side of the substrate by a molding process. Following the encapsulation and subsequent curing of the EMC, acoustic microscopy may be employed to inspect the hybrid assembly for delamination at any of the attachment interfaces before surface mount components are attached to an opposing second side of the hybrid assembly substrate, for example, by a surface mount technology (SMT) process.

SUMMARY

Because the encapsulation process, described in brief above, may induce stress and strain concentrations along the hybrid substrate, which can cause delamination of attachment interfaces, embodiments of systems and associated methods, disclosed herein, are directed toward alleviating these stress and strain concentrations.

According to some methods, while electronic components and the attachment interfaces of a hybrid assembly are encapsulated on a first side of a substrate of the assembly, the assembly is supported by a fluid medium from an opposing second side of the substrate. The fluid medium may be supplied to a trench of an encapsulation system, and a balancing pressure is maintained by the medium within the trench to support the hybrid assembly during the encapsulation process. In some methods of encapsulation, an outer perimeter portion of the substrate of the hybrid assembly is clamped between first and second mold chases of a mold assembly, wherein a molding cavity is formed within the first mold chase to contain electronic components, attachment interfaces thereof, and the encapsulation material on the first side of the substrate, and the aforementioned trench is formed in the second mold chase to contain traces and a patterned solder mask, formed on the second side of the substrate, and the aforementioned fluid medium.

According to some embodiments, an encapsulation system includes a fluid supply coupled to a trench of a mold assembly; when the hybrid assembly is loaded into the mold assembly so that a molding cavity of the mold assembly contains electronic components and the attachment interfaces thereof, which are attached to a first side of a substrate of the assembly, the trench contains traces and a patterned solder mask of a hybrid assembly, formed on an opposing second side of the substrate, such that a volume of the fluid extends between the traces and patterned solder mask and a surface of the trench. The regulator regulates the fluid supply to maintain a balancing pressure that supports the loaded hybrid assembly while encapsulation material is injected into the molding cavity of the mold assembly.

BRIEF DESCRIPTION OF THE DRAWINGS

The following drawings are illustrative of particular embodiments of the present invention and therefore do not limit the scope of the invention. The drawings are not to scale (unless so stated) and are intended for use in conjunction with the explanations in the following detailed description. Embodiments will hereinafter be described in conjunction with the appended drawings wherein like numerals/letters denote like elements, and.

DETAILED DESCRIPTION

The following detailed description is exemplary in nature and is not intended to limit the scope, applicability, or configuration of the invention in any way. Rather, the following description provides practical examples, and those skilled in the art will recognize that some of the examples may have suitable alternatives.

Figure 1A:
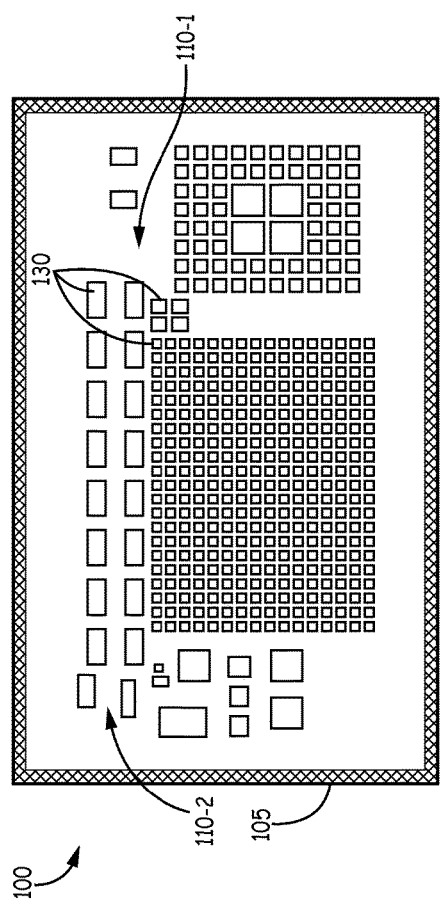
FIG. 1A is a plan view of an exemplary hybrid assembly.
Figure 1B:
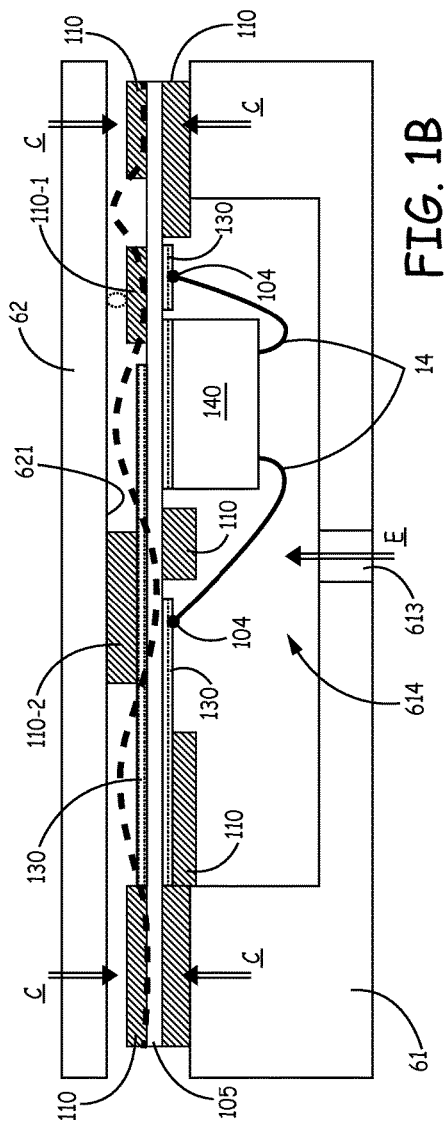
FIG. 1B is cross-section schematic of the exemplary hybrid assembly loaded between mold chases of a prior art encapsulation system.

FIG. 1A is a plan view of one side of an exemplary hybrid assembly 100. FIG. 1A illustrates the exemplary assembly 100 including a substrate 105, for example, a printed wiring board, on which a patterned solder mask 110 and copper traces 130 have been formed for the attachment of surface mount components, for example, by an SMT process. On an opposite side of substrate 105, electronic components, such as silicon dies, are adhered and electrically connected, for example, by a wire bond, solder joint bond, or a diffusion bond, to another attached component/die and/or to substrate 105, according to methods known to those skilled in the art. FIG. 1B is a cross-section schematic of the exemplary hybrid assembly 100, wherein a wire bonded die 140 can be seen attached to substrate 105, for example, by a conductive or non-conductive die adhesive material dispensed on a die attach pad. FIG. 1B illustrates die 140 electrically connected to substrate 105 by wire bonds 104 of two wires 14, wherein copper traces 130 form substrate pads with which wire bonds 104 are formed. With reference to FIGS. 1A-B, the first side of substrate 105 will be designated as that to which electronic components (e.g. die 140) are attached, and the second side of substrate 105 as that which is shown in FIG. 1A, with patterned solder mask 110 and copper traces 130 formed thereon.

A profile of patterned solder mask 110 on both sides of substrate 105 may be seen in FIG. 1B. And, in FIGS. 1A-B, zones 110-1, 110-2 of two exemplary profile heights for the solder mask, relative to the native surface of the second side of substrate 105, are designated, wherein, for example, a profile height for zone 110-1 may be approximately 30 micrometers, and a profile height for zone 110-2 may be approximately 48 micrometers.

FIG. 1B further illustrates the exemplary hybrid assembly loaded between first and second mold chases 61, 62 of a mold assembly. With reference to FIG. 1B, when second mold chase 62 is moved toward first mold chase 61, to clamp the assembly in the system with a clamping force, per arrows C, for example, around an outer perimeter portion of assembly 100 (e.g., designated with cross-hatching in FIG. 1A), a surface 621 of second mold chase 62 makes initial contact with the taller solder mask zone 110-2. Upon clamping substrate 105 between mold chases 61, 62, an encapsulation material (e.g., EMC) is injected through a gate 613, per arrow E, and into a molding cavity 614 of first mold chase 61 to encapsulate electronic components and attachment interfaces thereof, for example, die 140 and wire bonds 104/14 thereof. A bold dashed line in FIG. 1B estimates an expected deflection curve of substrate 105 due local stresses and strains induced by the clamping force and molding pressure during the encapsulation process, since surface 621 of second mold chase 62 does not evenly support the second side of substrate 105 due to the varying profile, or contour of patterned solder mask 110 across zones 110-1 and 110-2, and/or due to a particle of foreign material (shown with a dotted-line), which may become trapped between the second side of substrate 105 and second mold chase 62. Because these stresses and strains may cause delamination of attachment interfaces along the first side of substrate 105, systems and associated methods of the present invention are directed toward alleviating these stresses and strains.

Figure 2:
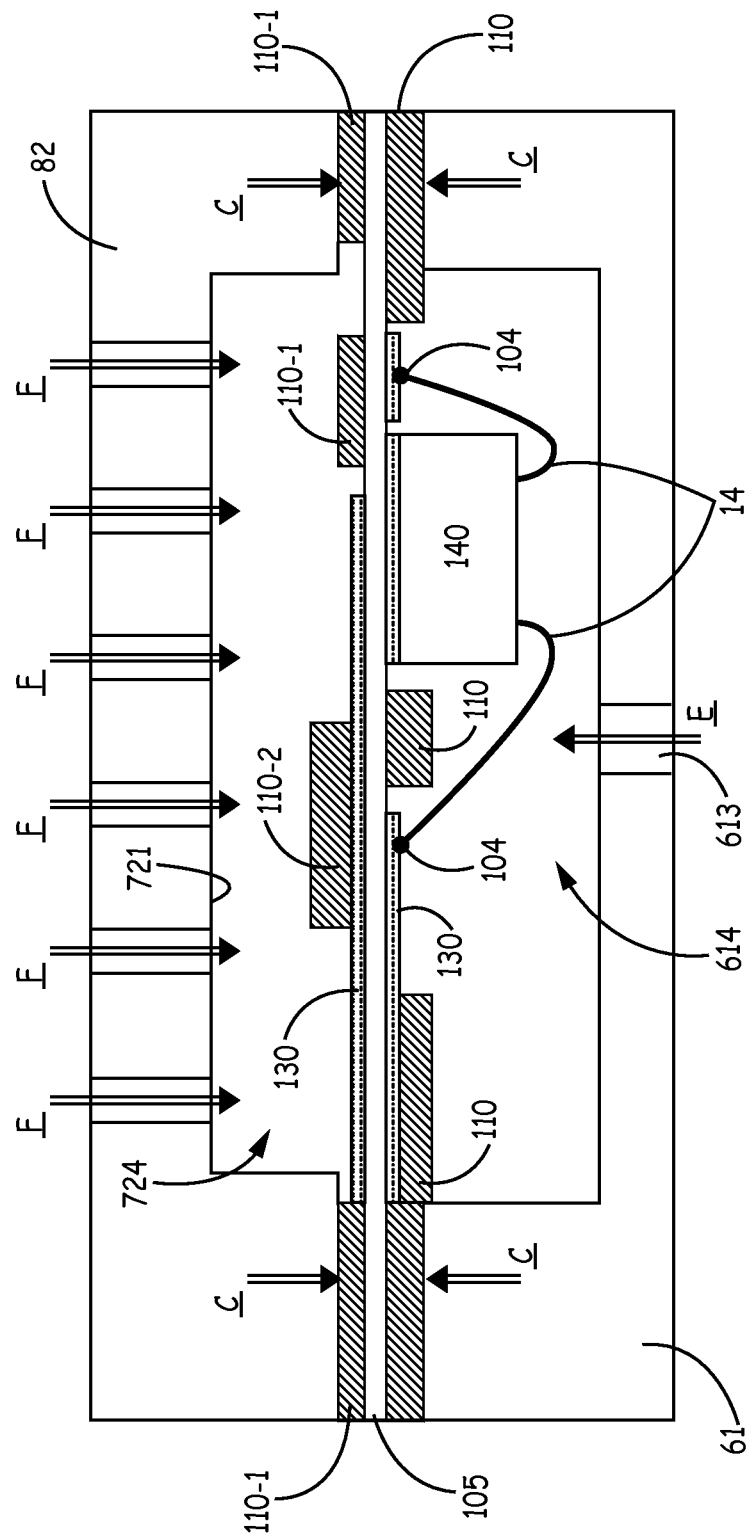
FIG. 2 is a cross-section schematic of the exemplary hybrid assembly supported during an encapsulation process, according to some methods of the present invention.

FIG. 2 is a cross-section schematic of the exemplary hybrid assembly supported during an encapsulation process, according to some methods, wherein a fluid medium, for example, a cushion of compressed gas, such as air, is employed to support the second side of substrate 105 during the encapsulation process. FIG. 2 illustrates substrate 105 clamped between first and second mold chases 61, 72, wherein the fluid medium is supplied, per arrows F, to a trench 724 formed in second mold chase 72. FIG. 2 further illustrates a surface 721 of trench 724 offset from traces 130 and both zones 110-1, 110-2 of the portion of patterned solder mask 110 contained in trench 724, so that a volume of the medium can extend between surface 721 and traces 130 and patterned solder mask 110. A balancing pressure is maintained by the medium within trench 724, during the injection of encapsulation material, per arrow E, so that substrate 105 is supported uniformly from the second side of substrate 105, across the varying contour thereof. According to an exemplary embodiment, a depth of trench 724 may be slightly greater than approximately 3 millimeters, to provide the aforementioned offset of surface 721, not only from a maximum height of the patterned solder mask 110 (e.g., zone 110-2), but also from any particles of foreign material that may become trapped between substrate 105 and second mold chase 72. Although FIG. 2 illustrates a plurality of channels through which the medium is supplied, a single channel may be employed, and a particular configuration of such a channel or channels is not critical for the application and maintenance of a sufficient static pressure to support substrate 105 during the encapsulation process.

Figure 3:
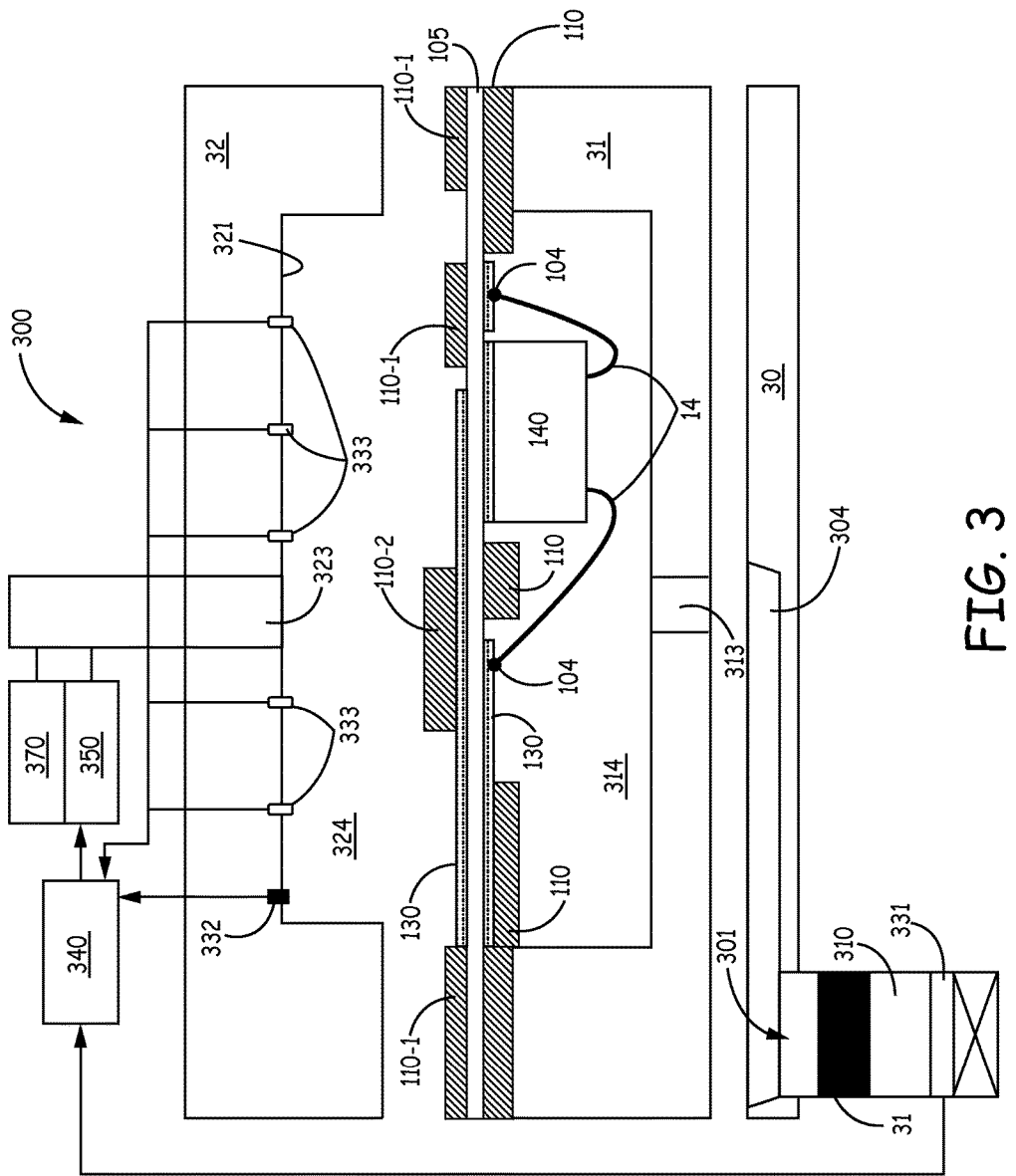
FIG. 3 is a cross-section schematic of a system for encapsulating a hybrid assembly, according to some methods and embodiments of the present invention.

FIG. 3 is a cross-section schematic of a system 300 for encapsulating a hybrid assembly, according to some methods and embodiments of the present invention. FIG. 3 illustrates a mold assembly of system 300 including a first mold chase 31, in which a molding cavity 314 is formed, a second mold chase 32, in which a trench 324 is formed, and a lower mold chase 30, in which a runner 304 is formed. Encapsulation material in the form of an EMC tablet 31 is shown loaded through a cull 301 of lower chase 30 so that a plunger 310 of the mold assembly can push tablet 31 up through runner 304 for injection of the material through a gate 313 and into molding cavity 314 of first mold chase 31. FIG. 3 further illustrates the mold assembly of system 300 including a force sensor 331 coupled to plunger 310 and to a controller 340 of system 300, wherein controller 340 receives a parameter indicative of a pressure within molding cavity 314, according to input from force sensor 331, and controls a regulator 350 of a fluid supply 370 (e.g., compressed air) of system 300.

According to the illustrated embodiment, when lower mold chase 30 is moved into position relative to first mold chase 31, and first and second mold chases 31, 32 are moved together to clamp substrate 105 therebetween, plunger 310 may be activated to push tablet 31, so that the encapsulation material thereof is injected through runner 304 and gate 313, and into molding cavity 314 to encapsulate electronic components and attachment interfaces thereof, for example, die 140 and wire bonds 104/14 thereof. First and second mold chases 31, 32 are each configured to form a sealed interface with the corresponding side of substrate 105 for example, around the aforementioned outer perimeter portion thereof, when substrate 105 is clamped therebetween (e.g., with a force between approximately 150 kN and approximately 300 kN). As the encapsulation material is being injected over the first side of substrate 105 (e.g., with a minimum injection pressure of approximately 40 kgf/cm$^2$) and pressurized in molding cavity 314, supply 370 sends a volume of fluid through a channel 323 of second mold chase 32 to extend between a surface 321 of trench 324 and traces 130 and patterned solder mask 110 within trench 324, and regulator 350 maintains a balancing pressure of the fluid in trench 324 to support substrate 105 from the second side thereof, for example, being feedback controlled by controller 340 via inputs from force sensor 331 and a pressure sensor 332 located in trench 324.

Figure 4:
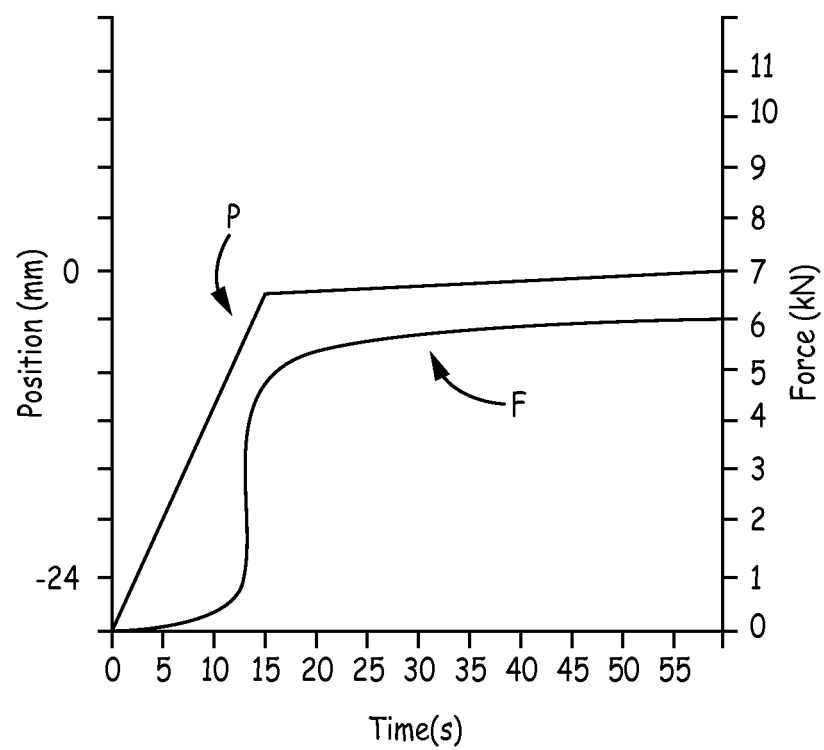
FIG. 4 is an exemplary plot of plunger position versus time, and a corresponding exemplary plot of plunger force versus time, that may correspond to system of FIG. 3.

FIG. 4 is an exemplary plot of plunger position versus time P, and a corresponding exemplary plot of plunger force versus time F, that may correspond to system 300. With reference to the illustrated plots, pressure within molding cavity increases rapidly when the plunger has pushed a majority of the encapsulation material into the molding cavity. As described above, controller 340 of system 300 receives an input parameter from force sensor 331 (e.g., comparable to plot F) and estimates, from that parameter, the pressure in molding cavity 314; controller 340 may then cause regulator 350 to ramp up, within approximately one to three seconds, the pressure of the supplied fluid in trench 324 so that it matches the pressure in molding cavity 314, for example, as confirmed by pressure sensor 332. The time necessary to completely fill molding cavity 314 with the encapsulation material and to complete the encapsulation process may be about 3 minutes, after which plunger 310 is pulled back to release the molding pressure on the first side of substrate 105 and regulator 350 simultaneously releases the fluid pressure on the second side of substrate 105. The release of the fluid pressure may be controlled via input from force sensor 331 or by a pre-set time programmed into controller 340.

With further reference to FIG. 3, the mold assembly of system 300 may further include an array of proximity sensors 333, which are mounted along trench surface 321 of second mold chase 32 and are coupled to controller 340, either in addition to pressure sensor 332, or in lieu of pressure sensor 332. When included in system 300, proximity sensors 333 monitor a distance of each of a plurality of locations along the second side of substrate 105 from trench surface 321 and provide the proximity input to controller 340. The proximity input from sensors 333 may be compared to pre-programmed profile data for the particular hybrid assembly loaded in system 300, so that any deflection of substrate 105 can be detected during the encapsulation process for the feedback control of the fluid supply regulator 350 to maintain a proper fluid pressure in trench that keeps substrate relatively flat and free of stresses and strains that could lead to the aforementioned delamination.

Although the embodiment of FIG. 3 is illustrated having multiple discrete sensors, it should be noted that in alternative embodiments, the functionality of two or more of the sensors (e.g., 331, 332, 333) may be embodied in one sensor. In addition, the functionality of two or more of the components, such as the regulator 350, sensor 331, sensor 332, sensor 333, or controller 340 may be embodied in a single component. For simplicity, component embodied with the functionality of such multiple functions may be referred to as a regulator.

Figure 5:
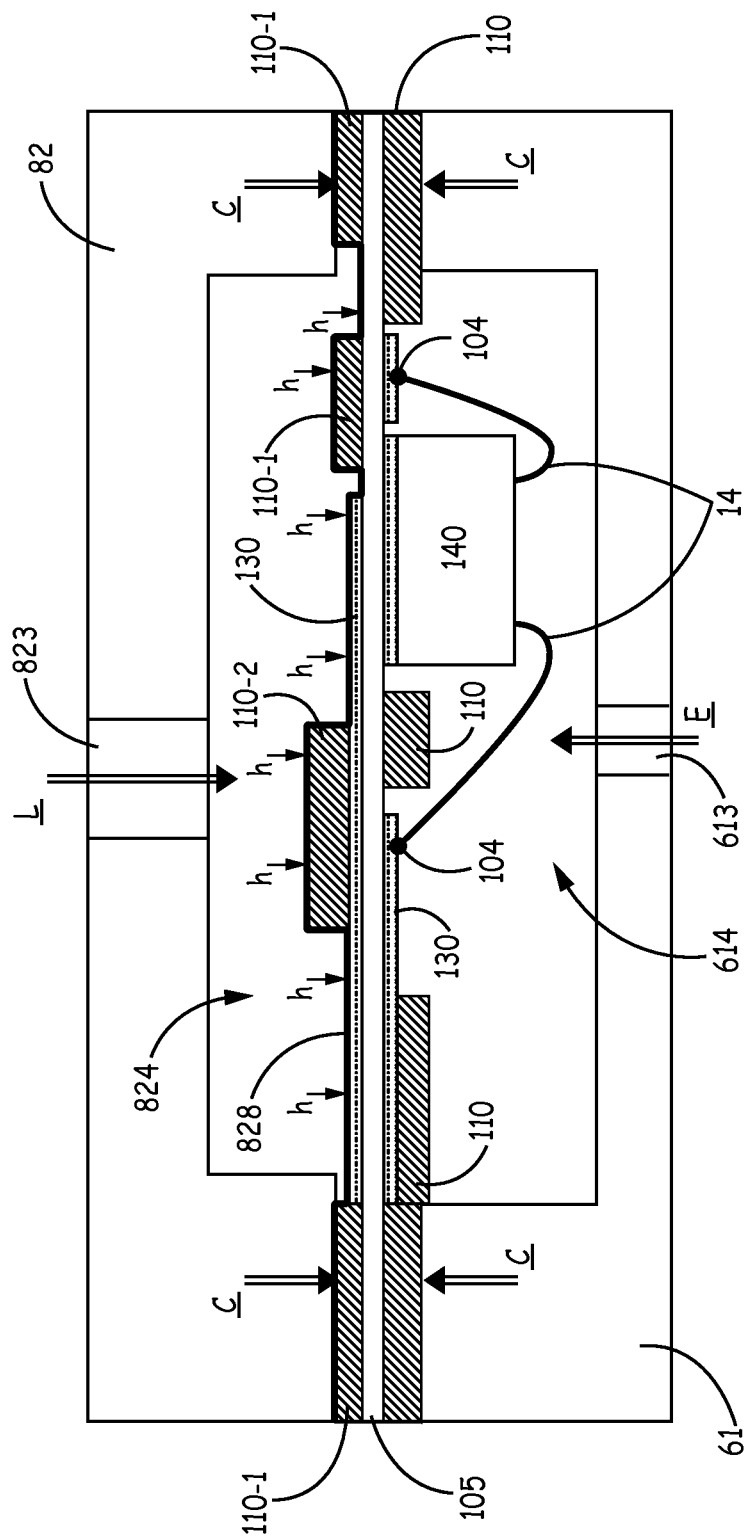
FIG. 5 is a cross-section schematic of the exemplary hybrid assembly supported during encapsulation, according to some alternate embodiments and methods.

FIG. 5 is a cross-section schematic of the exemplary hybrid assembly supported during encapsulation, according to some alternate embodiments and methods, wherein a liquid, such as oil, is employed as the fluid. FIG. 5 illustrates substrate 105 clamped between first and second mold chases 61, 82, wherein the liquid is supplied, through a channel 823 of second mold chase 82, per arrow L, to a trench 824 formed in second mold chase 82. The liquid may be delivered from a fluid supply and regulated by a regulator and associated controller similar to that described above for system 300, whereby a hydrostatic pressure, per arrows h, is maintained to support substrate 105 as an encapsulation material is injected through gate 613, per arrow E, and into molding cavity 614 of first mold chase 61 to encapsulate electronic components and attachment interfaces thereof, for example, die 140 and wire bonds 104/14 thereof. FIG. 5 further illustrates a flexible diaphragm 828 (e.g., an Ethylene Tetrafluoroethylene (ETFE) based film) attached to second mold chase 82. According to the illustrated embodiment, diaphragm 828 extends between the supporting fluid and traces 130 and patterned solder mask 110, conforming to the profile/contour of the second side of substrate 105 when the hydrostatic pressure is maintained during the encapsulation process.

In the foregoing detailed description, the invention has been described with reference to specific embodiments. However, it may be appreciated that various modifications and changes can be made without departing from the scope of the invention as set forth in the appended claims.

The invention claimed is:

1. A method for supporting a hybrid assembly during a process that encapsulates a first side of a substrate of the hybrid assembly, the method comprising:
    loading the hybrid assembly into an encapsulation system such that the first side of the substrate is located in a molding cavity of the encapsulation system, and such that a second side of the substrate of the hybrid assembly that is opposite the first side is located in a trench of the encapsulation system, with the second side being offset from an interior surface of the trench to define a gap therebetween;
    delivering encapsulation material into only the molding cavity to encapsulate only the first side;
    supplying a fluid into the trench, wherein the fluid comprises compressed gas; and
    maintaining a balancing pressure within the trench with the supplied fluid to support the hybrid assembly during the delivery of the encapsulation material.

2. The method of claim 1, further comprising determining a first pressure applied against the first side of the hybrid assembly during the delivery of the encapsulation material, wherein maintaining the balancing pressure with the fluid comprises controlling the delivery of the supplied fluid to generate a second pressure that corresponds to the first pressure.

3. The method of claim 1, further comprising monitoring a distance between at least one of a plurality of locations on the second side of the substrate and the interior surface of the trench, wherein maintaining the balancing pressure with the fluid comprises controlling the delivery of the supplied fluid to generate a second pressure that maintains the distance within a predetermined value.

4. The method of claim 1, further comprising determining a first pressure within the trench, wherein maintaining the balancing pressure comprises controlling the delivery of the encapsulation material to generate a second pressure within the molding cavity that corresponds to the first pressure.

5. The method of claim 1, further comprising monitoring a distance between at least one of a plurality of locations on the second side of the substrate and the interior surface of the trench, wherein maintaining the balancing pressure with the fluid comprises controlling the delivery of the encapsulation material to generate a second pressure that maintains the distance within a predetermined value.

6. The method of claim 1, wherein loading the hybrid assembly into the encapsulation system comprises clamping an outer perimeter portion of the substrate of the hybrid assembly between first and second mold chases of the encapsulation system such that a sealed interface is formed between the first mold chase and the first side of the substrate and between the second mold chase and the opposing second side of the substrate.

7. A method for encapsulating a hybrid assembly of electronic components, the hybrid having opposing first and second sides, the method comprising:
    clamping an outer perimeter portion of the hybrid assembly between first and second mold chases of an encapsulation system such that a sealed interface is formed between the first mold chase and the first side of the hybrid assembly and between the second mold chase and the second side of the hybrid assembly such that the hybrid assembly is located within a molding cavity of the first mold chase and a trench of the second mold chase, wherein a majority of the first and second sides of the hybrid assembly is configured to be offset from a first surface of the first mold chase and a second surface of the second mold chase to define a gap therebetween;
    activating a plunger to inject encapsulation material into only the molding cavity of the first mold chase, after clamping the hybrid assembly;

supplying fluid to the trench of the second mold chase during the injection of the encapsulation material, wherein the fluid comprises compressed gas; and maintaining a balancing pressure within the trench to support the hybrid assembly, from the second side of the hybrid assembly, during the injection of the encapsulation material into the molding cavity.

8. The method of claim 7, further comprising determining a first pressure generated by the encapsulation material against the first side of the hybrid assembly during the injection of the encapsulation material into the molding cavity, wherein maintaining the balancing pressure comprises controlling delivery of the fluid to generate a second pressure within the trench corresponding to the first pressure.

9. The method of claim 8, wherein determining the first pressure comprises monitoring a distance between at least one of a plurality of locations on the second side of the hybrid assembly and the second surface of the second mold chase.

10. The method of claim 8, further comprising estimating a pressure within one of the molding cavity or the trench, and wherein maintaining the balancing pressure comprises controlling delivery of the fluid or encapsulation material to generate a corresponding pressure within the other of the trench or molding cavity.

11. The method of claim 10, further comprising monitoring a distance between each of a plurality of locations on the second side of the hybrid assembly and the second surface of the second mold chase, wherein maintaining the balancing pressure comprises controlling delivery of the fluid or encapsulation material to generate a corresponding pressure based on the monitored distance.

* * * * *